United States Patent
Liu et al.

(10) Patent No.: US 11,832,455 B2
(45) Date of Patent: Nov. 28, 2023

(54) DISPLAY PANEL AND DISPLAY DEVICE

(71) Applicant: YUNGU (GU'AN) TECHNOLOGY CO., LTD., Hebei (CN)

(72) Inventors: Mingxing Liu, Jiangsu (CN); Ying Zhao, Jiangsu (CN); Bing Han, Jiangsu (CN); Shuaiyan Gan, Jiangsu (CN)

(73) Assignee: YUNGU (GU'AN) TECHNOLOGY CO., LTD., Hebei (CN)

( * ) Notice: Subject to any disclaimer, the term of this patent is extended or adjusted under 35 U.S.C. 154(b) by 361 days.

(21) Appl. No.: 17/403,412

(22) Filed: Aug. 16, 2021

(65) Prior Publication Data

US 2021/0376011 A1 Dec. 2, 2021

Related U.S. Application Data

(63) Continuation of application No. PCT/CN2020/081225, filed on Mar. 25, 2020.

(30) Foreign Application Priority Data

Jul. 19, 2019 (CN) .......................... 201910655532.1

(51) Int. Cl.
  *H10K 59/35* (2023.01)
(52) U.S. Cl.
  CPC .................................. *H10K 59/353* (2023.02)
(58) Field of Classification Search
  CPC .................................................... H10K 59/353
  USPC .......................................................... 257/40
  See application file for complete search history.

(56) References Cited

U.S. PATENT DOCUMENTS

| | | |
|---|---|---|
| 2016/0042702 A1 | 2/2016 | Hirakata et al. |
| 2016/0300519 A1 | 10/2016 | Shi et al. |
| 2019/0326366 A1* | 10/2019 | Fan ........................ H10K 59/35 |
| 2019/0355795 A1 | 11/2019 | Liu et al. |

(Continued)

FOREIGN PATENT DOCUMENTS

| | | |
|---|---|---|
| CN | 103927946 A | 7/2014 |
| CN | 107359176 A | 11/2017 |

(Continued)

OTHER PUBLICATIONS

Chinese Notice of Allowance(CN Application No. 201910655532. 1) Search Result with English Translation, dated Jan. 5, 2022, 4 pages.

(Continued)

*Primary Examiner* — Xia L Cross
(74) *Attorney, Agent, or Firm* — Quarles & Brady LLP

(57) ABSTRACT

The present application relates to display panel. An opening area of any one of sub-pixels of the first transitional display region is larger than an opening area of a same-colored sub-pixel of the first display region and is smaller than an opening area of a same-colored sub-pixel of the second display region. An interval between any two closest sub-pixels of a same color arranged in adjacent columns in the first display region is x; an interval between any two closest sub-pixels of a same color arranged in two adjacent columns respectively in the first transitional display region and the second display region is y; an interval between any two closest sub-pixels of a same color arranged in two adjacent columns in the second display region is z, wherein $x \leq y \leq z$. The present application also provides a display device.

19 Claims, 5 Drawing Sheets

(56) References Cited

U.S. PATENT DOCUMENTS

| | | | |
|---|---|---|---|
| 2020/0066809 A1* | 2/2020 | Liu | G09G 3/3225 |
| 2020/0203450 A1 | 6/2020 | Lou et al. | |
| 2020/0227488 A1 | 7/2020 | Xin et al. | |
| 2020/0312832 A1* | 10/2020 | Chi | H10K 59/353 |
| 2020/0411607 A1* | 12/2020 | Jian | H10K 59/131 |

FOREIGN PATENT DOCUMENTS

| | | |
|---|---|---|
| CN | 107633802 | 1/2018 |
| CN | 107819023 A | 3/2018 |
| CN | 107886850 A | 4/2018 |
| CN | 108269840 A | 7/2018 |
| CN | 108807458 A | 11/2018 |
| CN | 108828851 A | 11/2018 |
| CN | 109192076 A | 1/2019 |
| CN | 109427850 A | 3/2019 |
| CN | 109755282 A | 5/2019 |
| CN | 109950288 | 6/2019 |
| CN | 109962092 A | 7/2019 |
| CN | 209056269 U | 7/2019 |
| CN | 110379836 A | 10/2019 |
| EP | 3678119 A1 | 8/2020 |
| TW | 201839745 A | 11/2018 |
| TW | 201842484 A | 12/2018 |
| TW | 201926306 A | 7/2019 |
| WO | WO2019062221 A1 | 4/2019 |

OTHER PUBLICATIONS

International Search Report and Written Opinion (International Application No. PCT/CN2020/081225) with English Translation, dated May 15, 2020, 11 pages.

Chinese First Office Action 100191 (CN Application No. 201910655532.1) and Search Result with English Translation, dated Apr. 2, 2021, 22 pages.

Taiwan First Office Action (TW Application No. 109112417) and Search Result with English Translation, dated Dec. 7, 2020, 7 pages.

\* cited by examiner

DISPLAY PANEL AND DISPLAY DEVICE

CROSS-REFERENCE TO RELATED APPLICATIONS

This application is a continuation of international patent application No. PCT/CN2020/081225, entitled "DISPLAY PANEL AND DISPLAY DEVICE", filed on Mar. 25, 2020, which claims priority to Chinese Patent Application No. 201910655532.1, filed on Jul. 19, 2019, both of which are hereby incorporated by reference in their entireties.

TECHNICAL FIELD

The present application relates to the field of display technology.

BACKGROUND

In the field of display technology, a full-screen is becoming one of the major development directions. Compared with a conventional display screen, the full-screen has a higher screen-to-body ratio. However, other functional devices, such as a camera for taking pictures, are often disposed in the devices that require the display screens, such as cell phones.

SUMMARY

In view of this, there is a need to provide a display panel and a display device to address the problem of brightness inconsistency between the transparent display region and the normal display region, thereby improving the display performance.

According to an aspect of the present application, a display panel is provided. The display panel includes a first display region, a second display region, and a first transitional display region located between the first display region and the second display region. A density of the sub-pixels of the first display region is greater than a density of the sub-pixels of the second display region.

The sub-pixels of the first display region are arranged in a plurality of columns; each of the columns includes a plurality of sub-pixels of different colors arranged alternatively. Among the plurality of columns in the first display region, the sub-pixels of a same color disposed in two adjacent columns are arranged in a staggered manner.

The sub-pixels of the second display region are arranged in a plurality of columns; each of the columns includes a plurality of sub-pixels of different colors arranged alternatively. Among the plurality of columns in the second display region, the sub-pixels of a same color disposed in two adjacent columns are arranged in a staggered manner.

Any two sub-pixels of a same color disposed in two adjacent columns respectively disposed in the first transitional display region and the first display region are arranged in a staggered manner, any two sub-pixels of a same color disposed in two adjacent columns respectively disposed in the first transitional display region and the second display region are arranged in a staggered manner.

An opening area of any one of the sub-pixels disposed in the first transitional display region is larger than an opening area of a sub-pixel disposed in the first display region and having a same color with the one of the sub-pixels disposed in the first transitional display region, and is smaller than an opening area of a sub-pixel disposed in the second display region and having a same color with the one of the sub-pixels disposed in the first transitional display region.

An interval between any two closest sub-pixels of a same color arranged in two adjacent columns in the first display region is x; an interval between any two closest sub-pixels of a same color arranged in two adjacent columns respectively in the first transitional display region and the second display region is y; and an interval between any two closest sub-pixels of a same color arranged in two adjacent columns in the second display region is z.

$x \leq y \leq z$.

For the above-described display panel, the density of the sub-pixels, the opening ratio of the sub-pixels, and the brightness of the sub-pixels can be changed smoothly in a sequence of the first display region, the first transitional display region, and the second display region. Therefore, the visual difference caused by a difference between the density of the sub-pixels of the first display region and the density of the sub-pixels of the second display region can be effectively reduced, and the occurrence of dark spots or dark lines can be reduced, thereby improving the display performance. Furthermore, the relatively large mask opening in the mask plate and the relatively large intervals between adjacent mask openings are conducive to the manufacturing of the mask plate. In the sequence of the first display region, the first transitional display region, and the second display region, the opening area of each of the sub-pixels of a same color increases, and the minimum interval between the sub-pixels of a same color also increases, which facilitates the manufacturing of the mask plate, and reduces the unfavorable effects on the manufacturing of the mask plate and the stretching of the mask plate, the effects are caused by a large difference between the densities of the sub-pixels and a large difference between the opening ratios of the sub-pixels.

According to another aspect of the present application, a display device is provided, which includes the above-described display panel.

BRIEF DESCRIPTION OF THE DRAWINGS

In order to illustrate the embodiments of the present application more clearly, the drawings used in the embodiments will be described briefly. Apparently, the following described drawings are merely for the embodiments of the present application, and other drawings can be derived by those of ordinary skill in the art without any creative effort.

DETAILED DESCRIPTION

Figure 1:
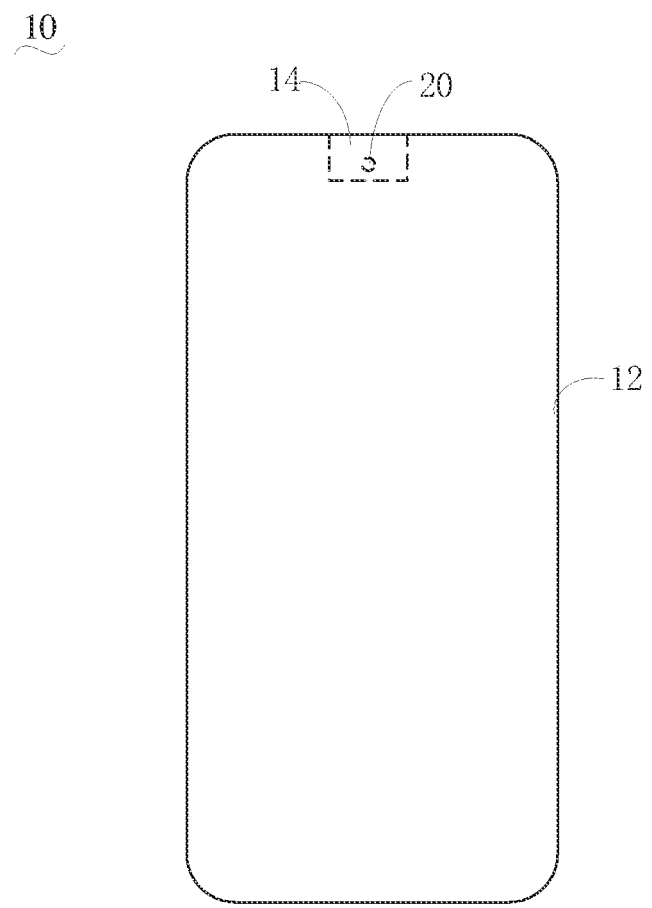
FIG. 1 is a schematic view of a display panel in an embodiment of the present application.

In order to facilitate understanding of the present application, the present application will be described in details below with reference to the related drawings. Some embodiments of the present application are shown in the drawings. However, the present application can be embodied in many different forms and is not limited to the embodiments described herein. Rather, the purpose of these embodiments is to provide a thorough understanding of the present application.

As described in the background, in recent years, more and more functions, such as fingerprint recognition, photosensitive touch control, face recognition, or iris recognition, are integrated into a display device. However, for the functions such as photographing, the video-recording, and face recognition, light needs to pass through the display panel and shine on a photosensitive component mounted on the rear side of the display panel, and therefore, the display panel is required to have a sufficiently high light-transmittance. Nevertheless, for the conventional display panel, as the resolution gets higher and higher, the density of the sub-pixels gets higher and higher, and accordingly, the number of pixel circuits is increasing. The transistors of the pixel circuits are formed by metal layers, because of the metal layers, light can not pass through the display panel easily, thereby reducing the light-transmittance of the display panel.

In the related art, a transparent display region with a low PPI and a high light-transmittance are provided in the display panel. Specifically, the density of the sub-pixels of the transparent display region is lower than that of the normal display region, in such a way, the transparent display region has two functions of transparency and display. However, the display brightness of the transparent display region with the relatively low PPI is significantly lower than that of the normal display region. In addition, as the transparent display region has fewer pixels per unit area than the normal display region, the number of openings of the mask plate for vapor deposition corresponding to the transparent display region is different from the number of those corresponding to the normal display region, which may cause problems such as wrinkles, warps, and breaks of the mask plate, thereby leading to a plurality of defects, such as blooming and offset of the layer for vapor deposition, affecting the quality of vapor deposition.

In order to solve the above-described problems, the present application provides a display panel and a display device, which can improve the above-described problems.

In order to facilitate understanding the technical solutions of the present application, some technical terms in the present application are explained before describing the present application in detail.

At present, a display panel typically has a relatively high pixel density, i.e., the pixels per inch (PPI). In the related art, in order to realize a full-screen display while being compatible with a camera, a display region with a low PPI and a high light-transmittance is provided in the display panel. Since the transparency and the display function of the transparent display region must be considered, the PPI of the transparent display region is relatively low, and the display brightness of this transparent display region will be reduced. Therefore, there is a significant brightness difference between the transparent display region and the normal display region surrounding the transparent display region, which affects the display performance.

Figure 2:
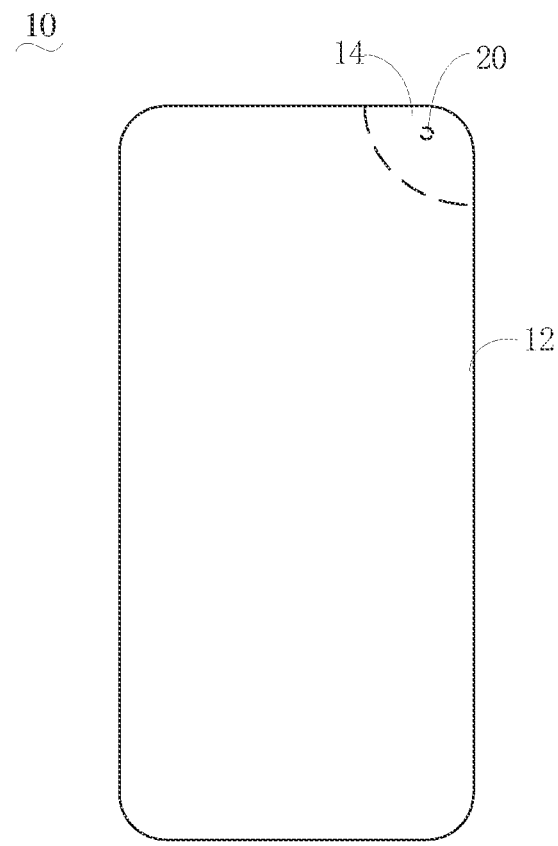
FIG. 2 is a schematic view of a display panel in another embodiment of the present application.
Figure 4:
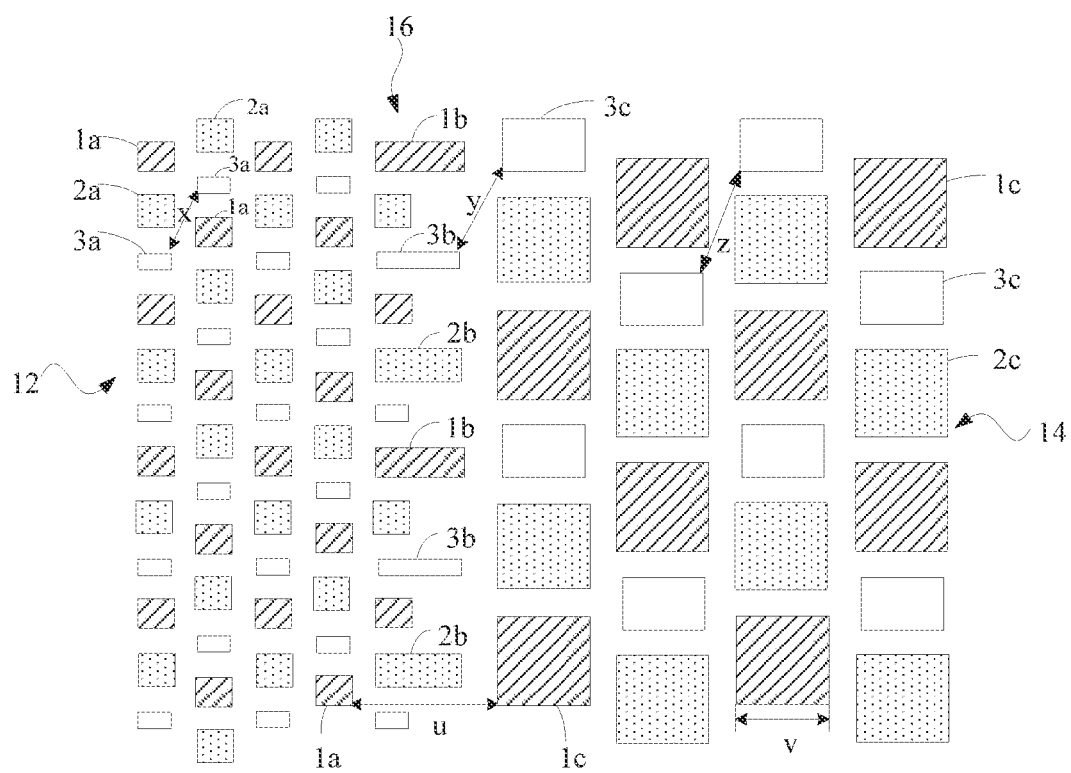
FIG. 4 is a schematic view of an arrangement of sub-pixels of a display panel in an embodiment of the present application.
Figure 5:
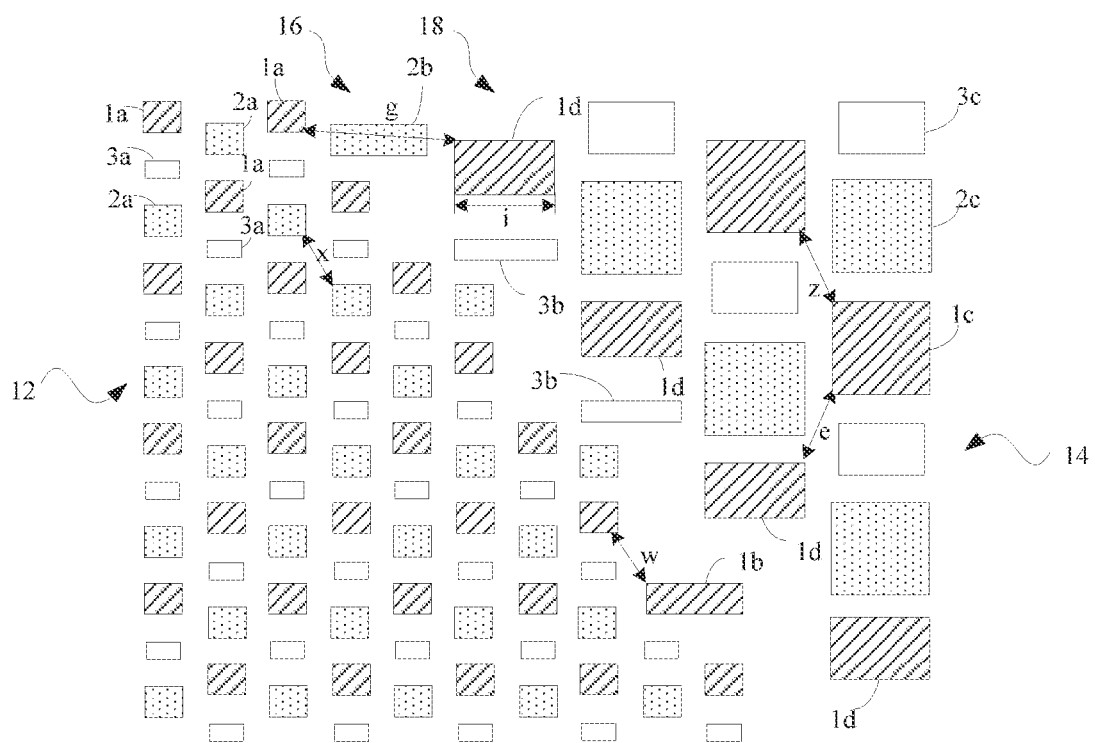
FIG. 5 is a schematic view of an arrangement of sub-pixels of a display panel in another embodiment of the present application.

A row direction refers to a transverse direction or a horizontal direction as shown in FIG. 4 and FIG. 5. A column direction refers to a longitudinal direction or a vertical direction as shown in FIG. 1 and FIG. 2. An opening area of a sub-pixel refers to an effective light-emitting area of the sub-pixel. An opening ratio of a sub-pixel refers to a ratio of the effective light-emitting area of the sub-pixel to a total area of the sub-pixel.

In order to facilitate description, the drawings merely illustrate structures relevant to embodiments of the present application.

The display panel 10 provided in the embodiments of the present application can be an organic light-emitting display panel 10. Specifically, the display panel 10 can include an anode, a cathode, and an organic light-emitting layer located between the anode and the cathode. A voltage is applied between the anode and the cathode, and carriers are excited to migrate, and the carriers effect on the organic light-emitting layer, and the organic light-emitting layer emits light. In some embodiments, the display panel 10 can be other types, and for example, can be a quantum-dot light-emitting display panel 10, a nanochip display panel 10, and the like, which are not repeatedly described herein.

Referring to FIG. 1 and FIG. 4, in an embodiment of the present application, the display panel 10 is provided with a first display region 12, a first transitional display region 16, and a second display region 14. The first display region 12 can be a primary display region. The second display region 14 can be a secondary display region, and at least one photosensitive component is disposed at the rear side of the second display region, the photosensitive component can be, for example, a camera. The first display region 12 can include a plurality of first sub-pixels 1a, a plurality of second sub-pixels 2a, and a plurality of third sub-pixels 3a; the first sub-pixel 1a, the second sub-pixel 2a, and the third sub-pixel 3a are respectively different colors. The second display region 14 can include a plurality of first sub-pixels 1c, a plurality of second sub-pixels 2c, and a plurality of third sub-pixels 3c; the first sub-pixel 1c, the second sub-pixel 2c, and the third sub-pixel 3c are respectively different colors. The first sub-pixel can be one color of red, blue, and green; the second sub-pixel can be one color of red, blue, and green, but different from the color of the first sub-pixel; and the third sub-pixel can be one color of red, blue, and green, but different from the color of the first sub-pixel and the color of the second sub-pixel. In an embodiment, the first transitional display region 16 can include a plurality of first sub-pixels 1b, a plurality of second sub-pixels 2b, and a plurality of third sub-pixels 3b; the first sub-pixel 1b, the second sub-pixel 2b, and the third sub-pixel 3b are respectively different colors. In another embodiment, referring to FIG. 5, the first transitional display region 16 can only include at most two types selected from the first sub-pixel 1b, the second sub-pixel 2b, and the third sub-pixel 3b; for example, the first transitional display region 16 can only include the second sub-pixels 2b and the third sub-pixels 3b.

Figure 3:
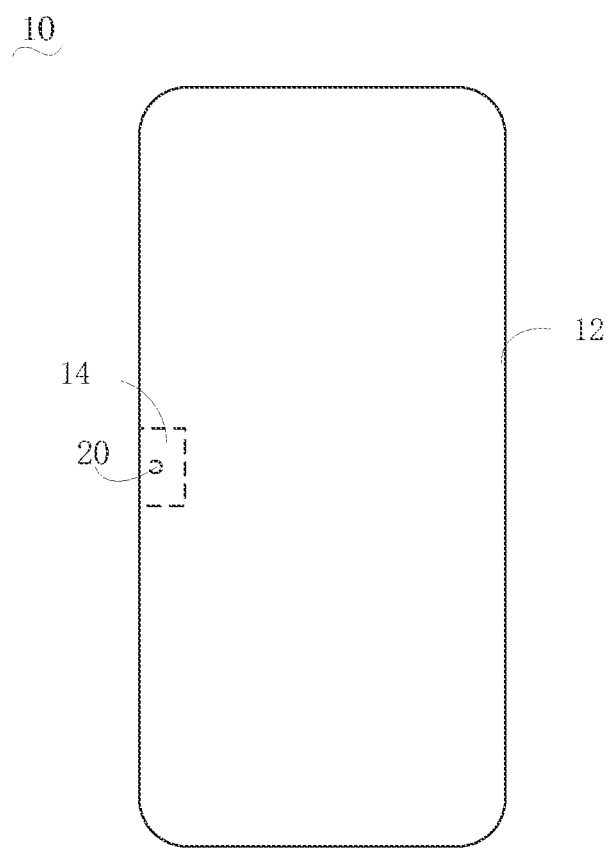
FIG. 3 is a schematic view of a display panel in yet another embodiment of the present application.

The first transitional display region 16 is located between the first display region 12 and the second display region 14, the first transitional display region 16 separates the first display region 12 from the second display region 14. For example, as shown in FIG. 1, the first transitional display region 16 and the second display region 14 are both located at an upper area of the display region of the display panel 10, and the first display region 12 is located at the rest area of the display region. Referring to FIG. 2 and FIG. 3, optionally, the second display region 14 can be located on a left side, a right side, or a lower side of the first display region 12, and the first display region 12 at least partially surrounds the second display region 14. The second display region 14 can have a regular shape, such as a rectangle, a circle, or the like. In some other embodiments, the shape of the second display region 14 can be irregular. Specifically, the shape of the second display region 14 can be designed according to factors such as the shape and the setting position of the photosensitive component 20 disposed at the rear side of the second display region 14, which is not limited herein.

In an embodiment of the present application, a density of the sub-pixels of the first display region 12 is greater than that of the second display region 14, so that the distance between the sub-pixels of the second display region 14 can be relatively large. The region between the sub-pixels can have a relatively high light-transmittance to meet the light collection requirement for the photosensitive component 20 located at the rear side of the second display region 14.

In an embodiment of the present application, the sub-pixels in the display panel 10 can be arranged in rows and/or in columns, that is, the display panel includes a plurality of rows of sub-pixels and/or a plurality of columns of sub-pixels, each row includes a plurality of sub-pixels of different colors, each column includes a plurality of sub-pixels. The following description only takes the embodiment in which the sub-pixels in the display panel 10 are arranged in columns as an example. It should be understood that the embodiment in which the sub-pixels in the display panel 10 are arranged in rows can also be achieved, and is equivalent to the embodiment in which the sub-pixels are arranged in columns, the "column" and the "row" mentioned below can be interchanged with each other.

The sub-pixels of the first display region 12 are arranged in a plurality of columns. Each of the columns includes a plurality of sub-pixels of different colors arranged alternatively. Among the plurality of columns, the sub-pixels of a same color disposed in two adjacent columns are arranged in a staggered manner.

The sub-pixels of the second display region 14 are arranged in a plurality of columns. Each of the columns includes a plurality of sub-pixels of different colors arranged alternatively. Among the plurality of columns, the sub-pixels of a same color disposed in two adjacent columns are arranged in a staggered manner.

Any two sub-pixels of a same color disposed in two adjacent columns respectively disposed in the first transitional display region 16 and the first display region 12 are arranged in a staggered manner, any two sub-pixels of a same color disposed in two adjacent columns respectively disposed in the first transitional display region 16 and the second display region 14 are arranged in a staggered manner.

In an embodiment, the sub-pixels disposed in the first transitional display region 16 are arranged in at least one column; each column includes at least one sub-pixel. In an embodiment, in the first transitional display region 16, the sub-pixels of different colors are alternatively arranged.

For example, in the embodiment shown in FIG. 4, each column can include a plurality of sub-pixels of different colors. In the first display region 12, the first sub-pixels 1a, the second sub-pixels 2a, and the third sub-pixels 3a are alternatively arranged. In the second display region 14, the first sub-pixels 1c, the second sub-pixels 2c, and the third sub-pixels 3c are alternatively arranged. Among the first display region 12, the first transitional display region 16, and the second display region 14, any two sub-pixels of a same color disposed in two adjacent columns respectively disposed in the first transitional display region 16 and the first display region 12 are arranged in a staggered manner, any two sub-pixels of a same color disposed in two adjacent columns respectively disposed in the first transitional display region 16 and the second display region 14 are arranged in a staggered manner.

In the present embodiment, on the one hand, the sub-pixels can be arranged in columns, the arrangement of the sub-pixels is relatively uniform, and the display effect is good. On the other hand, the arrangement of the sub-pixels disposed in the second display region 14 is the same as the arrangement of the sub-pixels disposed in the first display region 12, except that the density of the sub-pixels disposed in the second display region 14 is relatively small and the opening area of each of the sub-pixels disposed in the second display region 14 is relatively large, which facilitates reducing the brightness difference between the first display region 12 and the second display region 14, thereby achieving more uniform display performance compared with other arrangements. In addition, the deformation of the mask plate can be reduced, and the precision of vapor deposition can be improved. Furthermore, the sub-pixels of a same color in two adjacent columns are arranged in the staggered manner, which increases the combination ways of the pixel units (i.e., light-emitting units), and therefore the display performance is further improved.

In an embodiment of the present application, an opening area of any one of the sub-pixels arranged in the first transitional display region 16 is larger than an opening area of a sub-pixel arranged in the first display region 12 and having a same color with the one of the sub-pixels disposed in the first transitional display region 16, and is smaller than an opening area of a sub-pixel arranged in the second display region 14 and having a same color with the one of the sub-pixels disposed in the first transitional display region 16.

Optionally, an interval between any two closest sub-pixels of a same color arranged in two adjacent columns in the first display region 12 is x; an interval between any two closest sub-pixels of a same color arranged in two adjacent columns respectively in the first transitional display region 16 and the second display region 14 is y; an interval between any two closest sub-pixels of a same color arranged in two adjacent columns in the second display region 14 is z. That is, all intervals between any two closest sub-pixels of a same color disposed in the first display region 12 are equal; all intervals between any two closest sub-pixels of a same color respectively arranged in the first transitional display region 16 and the second display region 14 are equal, and all intervals between any two closest sub-pixels of a same color disposed in the second display region 14 are equal.

For example, in the embodiment shown in FIG. 4, the sub-pixels are uniformly distributed, and each sub-pixel has a rectangular shape. An interval between two closest sub-pixels of a same color is a distance between the two closest vertices of the two closest sub-pixels. Taking the third sub-pixels as an example, the interval between two closest third sub-pixels 3a in two adjacent columns in the first display region 12 is x, the interval between two closest third sub-pixels 3b and 3c respectively arranged in the first transitional display region 16 and the second display region 14 is y, and the interval between two closest third sub-pixels 3c in two adjacent columns in the second display region 14 is z.

Optionally, for the sub-pixels of a same color disposed in the first display region 12, the second display region 14, and the first transitional display region 16, $x \leq y \leq z$. With the same arrangement of the pixels, an opening ratio of the sub-pixels of each display region is determined by an opening area of the sub-pixels of a same color disposed in each display region, a density of the sub-pixels of each display region is determined by the minimum interval (i.e., the interval between the closest sub-pixels of a same color) between the sub-pixels of a same color disposed in each display region, the opening ratio and the density of the sub-pixels determine the light-emitting brightness and the display performance of each display region. In an embodiment of the present application, the opening area of the sub-pixel disposed in the first transitional display region 16 is greater than the opening area of the sub-pixel disposed in the first display region 12 and having a same color with the one of the sub-pixels disposed in the first transitional display region 16, and is smaller than the opening area of the sub-pixel disposed in the second display region 14 and having a same color with the one of the sub-pixels disposed in the first transitional display region 16; the minimum intervals between the sub-pixels of a same color disposed in different display regions satisfy x≤y≤z. In this way, in a sequence of the first display region 12, the first transitional display region 16, and the second display region 14, the density of the sub-pixels, the opening ratio of the sub-pixels, and the brightness of the sub-pixels are changed smoothly. Therefore, the visual difference caused by the difference between the density of the sub-pixels disposed in the first display region 12 and the density of the sub-pixels disposed in the second display region 14 can be effectively reduced, and the occurrence of dark spots or dark lines can be reduced, thereby improving the display performance. Furthermore, the relatively large mask openings in the mask plate and the relatively large intervals between adjacent openings are conducive to the manufacturing of the mask plate. In a sequence of the first display region 12, the first transitional display region 16 and the second display region 14, the opening area of each of the sub-pixels of a same color increases, and the minimum interval between the sub-pixels of a same color also increases, which facilitates the manufacturing of the mask plate, and reduces the unfavorable effects on the manufacturing of the mask plate and the stretching of the mask plate, the unfavorable effects are caused by the difference of the densities of the sub-pixels of those three display regions and the difference of the opening ratios of the sub-pixels of those three display regions. The opening region of the sub-pixel is the light-emitting region of the sub-pixel. For example, taking the technique of the Active Matrix Organic Light-Emitting Diode (AMOLED) as an example, the light-emitting layers of the sub-pixels are formed on a thin film transistor (TFT) array, and the amount of the current flowing to the sub-pixels are controlled by the TFT array, thereby determining the light-emitting intensity of each sub-pixel. In manufacturing, the number of openings of the sub-pixels and the area of the opening of the sub-pixel are defined by a pixel-defining layer, thereby defining the density of the sub-pixels and the opening ratio of the sub-pixels in different display regions. The above-described opening region of the sub-pixel refers to the opening region defined by the pixel-defining layer, and that is the light-emitting region of the sub-pixel.

Optionally, a boundary between the first display region 12 and first transitional display region 16 can be a straight line or a non-straight line. Specifically, in some embodiments, a shape of the boundary between the first display region 12 and the first transitional display region 16 can be in an arc shape, a zigzag shape, a square wave shape, etc., which are not limited herein. For example, in the embodiment shown in FIG. 4, the boundary between the first transitional display region 16 and the first display region 12 is a non-straight line, specifically, a shape of the boundary is shaped as a square wave shape. In the column direction, an opening region of a sub-pixel disposed in the first transitional display region 16 is aligned with an opening region of a sub-pixel disposed in the first display region 12 and adjacent to the sub-pixel disposed in the first transitional display region 16, that is, in the column direction, a side edge of the sub-pixel disposed in the first transitional display region 16 is aligned with a side edge of the adjacent sub-pixel disposed in the first display region 12, and the side edge of the sub-pixel disposed in the first transitional display region 16 is adjacent to the first display region 12, the side edge of the sub-pixel disposed in the first display region 12 is away from the first transitional display region 16; that is, the sub-pixels disposed in the first transitional display region 16 and the adjacent sub-pixels disposed in the first display region 12 are alternatively arranged in the column direction. In this way, the sub-pixels of the first transitional display region 16 and the sub-pixels of the first display region 12 can be uniformly distributed, so that the visual difference caused by the difference between the density of the sub-pixels in the first display region 12 and the density of the sub-pixels in the second display region 14 is further reduced, and the occurrence of dark spots or dark lines is further reduced, thereby improving the display performance. In some embodiments, in the column direction, a distance between a sub-pixel disposed in the first transitional display region 16 and an adjacent sub-pixel of a different color disposed in the first display region 12 is equal to a distance between the sub-pixel disposed in the first transitional display region 16 and another adjacent sub-pixel of a different color disposed in the first display region 12. In this way, it can be further ensured that the sub-pixels disposed in the first transitional display region 16 and the first display region 12 are arrange uniformly.

In order to make the display panel have a better display performance and ensure the density of the sub-pixels, the opening ratio of the sub-pixels and the brightness of the sub-pixels are changed more smoothly in the sequence of the first display region 12, the first transitional display region 16 and the second display region 14, the arrangement of the sub-pixels disposed in the first transitional display region 16 satisfies a certain condition. Optionally, a distance between two closest sub-pixels of a same color respectively arranged in the first display region 12 and the second display region 14 is u, and the two sub-pixels are adjacent to the sub-pixels of the first transitional display region 16 respectively; in the row direction, a size of the opening region of each of the sub-pixels of a same color disposed in the second display region 14 is v, wherein z≤u≤(z+v). In other words, as shown in FIG. 4, on the condition that z≤u≤(z+v), a sub-pixel 2b which having a different color with the two closet sub-pixels respectively disposed in the first display region 12 and the second display region 14 can be disposed between the two closest sub-pixels 1a and 1c of a same color, so that a better display performance can be ensured, and the density of the sub-pixels, the opening ratio of the sub-pixels, and the brightness of the sub-pixels can be changed more smoothly in a sequence of the first display region 12, the first transitional display region 16 and the second display region 14.

In some embodiments of the present application, two closest sub-pixels of a same color respectively arranged in the first transitional display region 16 and the first display region 12 share one data line. In other words, two closest sub-pixels of a same color respectively arranged in two adjacent columns respectively in the first transitional display region 16 and the first display region 12 share one data line. It should be understood that each sub-pixel has its own independent anode. When scanning, for example, the sub-pixels in each row can be turned on one by one. Since the PPI of the second display region 14 is smaller than the PPI of the first display region 12, a significant brightness difference may exist between the first display region 12 and the second display region 14 of the display panel 10. Since at least the adjacent sub-pixels of a same color respectively arranged in the first transitional display region 16 and the first display region 12 share one data line, the current values of the two adjacent sub-pixels respectively disposed in the first transitional display region 16 and the first display region 12 are equal. On the condition that the current values are equal, the larger the opening area of the sub-pixel is, the lower the brightness of the sub-pixel is, and therefore, the brightness of the sub-pixel can be changed smoothly or kept consistent from the first display region 12 to the first transitional display region 16, so that the visual difference caused by the difference between the brightness of the first display region 12 and the brightness of the second display region 14 is effectively reduced, and the occurrence of dark spots or dark lines between the first display region 12 and the second display region 14 is avoided.

Optionally, the sub-pixels of a same color respectively disposed in the first transitional display region 16 and the first display region 12 are arranged in a plurality of rows. In the row direction, the sub-pixels of a same color disposed in two adjacent columns are arranged in a staggered manner, on the same manufacture conditions, a distance between the openings of the sub-pixels of a same color disposed in two adjacent columns are relatively large with the staggered arrangement of the sub-pixels, which reduces the difficulty for manufacturing the mask plate, and reduces the difficulty of the vapor deposition, and therefore can reduce a size of a pixel unit, and facilitate the manufacturing of a high-resolution display panel. In addition, with the staggered arrangement of the sub-pixels, the data lines can extend from the first display region 12 to the first transitional display region 16 without being twisted or bent, which facilitates the manufacturing of the data lines. Besides, the sub-pixels of a same color sharing the same data line are located in the same row, which reduces the occurrence of bright or dark stripes. It should be understood that, with the same light-emitting area, the brightness of the sub-pixels of different colors are different. For example, the brightness of a green sub-pixel is the largest, and the brightness of a blue sub-pixel is the smallest. The alternative arrangement of the sub-pixels of different colors in each column is conductive to a formation of the pixel unit of RGB, the pixel unit is formed by the sub-pixels disposed in two adjacent columns respectively in the first transitional display region 16 and the first display region 12. Therefore, it can be ensured that the brightness of the sub-pixels can be smoothly changed from the first display region 12 to the first transitional display region 16, so that the display performance can be improved.

Optionally, the sub-pixels of a same color of a same row respectively disposed in the first transitional display region 16 and the first display region 12 share one data line. In this way, the difficulty for manufacturing the data line can be further reduced.

Optionally, in the column direction, the sizes of the opening regions of the sub-pixels of a same color respectively disposed in the first transitional display region 12 and the first display region 16 are equal.

For example, in the embodiment shown in FIG. 4, the light-emitting region of a sub-pixel disposed in the first transitional display region 16 is partially aligned with the light-emitting region of an adjacent sub-pixel disposed in the first display region 12 and having a different color with the sub-pixel disposed in the first transitional display region 16. In the column direction, the sub-pixels of different colors disposed in the first transitional display region 16 and the first display region 12 are alternatively arranged. Each sub-pixel has a rectangular shape. In the column direction, the sizes of the sub-pixels of a same color respectively disposed in the first display region 12 and the first transitional display region 16 are equal; and in the row direction, the sizes of the sub-pixels of a same color respectively disposed in the first display region 12 and the first transitional display region 16 are not equal, so that the opening areas of the sub-pixels of a same color respectively disposed in the first display region 12 and first transitional display region 16 are not equal. In this way, the data lines can extend from the first display region 12 to the first transitional display region 16 without being twisted or bent, which facilitates the manufacturing of the data lines and the arrangement of the sub-pixels. Accordingly, the arrangement of the sub-pixels is more uniform while the sub-pixel densities are different in different display regions, and the brightness of the sub-pixels can be smoothly changed from the first display region 12 to the first transitional display region 16, and the display performance can be improved.

Optionally, the sub-pixels of a same color disposed in the second display region 14 are arranged in a plurality of rows. For example, in the embodiment shown in FIG. 5, each sub-pixel of the second display region 14 has a rectangular shape. In the row direction, the sizes of the sub-pixels of a same color respectively disposed in the second display region 14 and the first transitional display region 16 can be equal. In the column direction, the size of each sub-pixel disposed in the second display region 14 is greater than that of each sub-pixel disposed in the first transitional display region 16 and having a same color with the sub-pixel disposed in the second display region 14, so that the opening area of each sub-pixel disposed in the second display region 14 is greater than the opening area of each sub-pixel disposed in the first transitional display region 16 and having a same color with the sub-pixel disposed in the second display region 14. In this way, the arrangement of the sub-pixels of the second display region 14 and the arrangement of the sub-pixels of the first display region 12 are the same, the density of the sub-pixels of the second display region 14 and the density of the sub-pixels of the first display region 12 are different, the opening area of each sub-pixel of the second display region 14 and the opening area of each sub-pixel of the first display region 12 are different. As compared with other arrangements, the brightness difference between the first display region 12 and the second display region 14 can be reduced to improve the uniformity of the display. In addition, the deformation of the mask plate can be avoided, and the accuracy of the vapor deposition can be improved. This arrangement is beneficial for a formation of the pixel unit of RGB, which is formed by the sub-pixels disposed in two adjacent columns respectively in the first transitional display region 16 and the second display region 14. Further, it can be ensured that the brightness of the sub-pixels is smoothly changed from the first transitional display region 16 to the second display region 14, so that the display performance can be improved.

The shape of the second display region 14 can be determined according to the structure and design of the photo-sensitive component 20. For example, in some embodiments, the shape of the second display region 14 is irregular; that is, the second display region 14 has a contour line shaped as an irregular shape (e.g., an arc shape) or an oblique line. For the sub-pixels adjacent to the boundary between the different display regions, the densities of the sub-pixels of the different display regions are different, and the opening areas of the sub-pixels of the different display regions are different, and the arrangements of the sub-pixels of the different display regions may be significantly different (for example, the distribution of the red sub-pixels, the green sub-pixels, and the blue sub-pixels is not uniform), thereby resulting in non-uniform brightness, dark spots, and dark lines. In some embodiments, a plurality of transitional display regions are provided between the first display region 12 and the second display region 14, the arrangements of the sub-pixels of the transitional display regions are different from that of the first display region 12 and that of the second display region 14, the opening areas of the sub-pixels of the transitional display regions are different from that of the first display region 12 and that of the second display region 14, the minimum intervals of the sub-pixels of a same color of the transitional display regions are different from that of the first display region 12 and that of the second display region 14, thereby reducing the visual difference caused by the difference between the brightness of the first display region 12 and the brightness of the second display region 14, and the occurrence of dark spots or dark lines can be effectively avoided.

Referring to FIG. 5, optionally, the display panel 10 further includes a second transitional display region 18 contiguous to the first transitional display region 16 and the second display region 14. The second transitional display region 18 is located between the first transitional display region 16 and the second display region 14. any two sub-pixels of a same color disposed in two adjacent columns respectively disposed in the second transitional display region 18 and the first transitional display region 16 are arranged in a staggered manner, any two sub-pixels of a same color disposed in two adjacent columns respectively disposed in the second transitional display region 18 and the second display region 14 are arranged in a staggered manner. An opening area of any one of the sub-pixels arranged in the first transitional display region 16 is smaller than an opening area of a sub-pixel arranged in the second transitional display region 18 and having a same color with the one of the sub-pixels arranged in the first transitional display region 16. An opening area of any one of the sub-pixels arranged in the second transitional display region 18 is smaller than an opening area of a sub-pixel arranged in the second display region 14 and having a same color with the one of the sub-pixels arranged in the second transitional display region 18. In this way, a visual transitional display can be formed by the first transitional display region 16 and the second transitional display region 18 to compensate for the brightness difference caused by the difference between the arrangements of the sub-pixels disposed in different display regions and adjacent to the irregular-shaped (e.g., an arc-shaped) contour line or the oblique contour line, so that the opening ratio can be changed smoothly in a sequence of the first display region 12, the first transitional display region 16, the second transitional display region 18, and the second display region 14, the uniformity of the brightness of the display panel 10 is improved, and the occurrence of dark spots and dark lines is reduced.

Optionally, an interval between any two closest sub-pixels of a same color arranged in two adjacent columns respectively in the first display region 12 and the first transitional display region 16 is w; an interval between any two closest sub-pixels of a same color arranged in two adjacent columns respectively in the second transitional display region 18 and the second display region 14 is e; wherein $x \leq w \leq e \leq z$. In this way, the density of sub-pixels, the opening ratio of the sub-pixels, and the brightness of sub-pixels can be changed smoothly in sequence of the first display region 12, the first transitional display region 16, the second transitional display region 18, and the second display region 14, so that the visual difference caused by the difference between the density of the sub-pixels of the first display region 12 and the density of the sub-pixels of the second display region 14 is reduced, and the occurrence of dark spots or dark lines can be further reduced, thereby improving the display performance. Furthermore, in sequence of the first display region 12, the first transitional display region 16, the second transitional display region 18, and the second display region 18, the opening area of each of the sub-pixels of a same color increases, and the minimum interval between the sub-pixels of a same color increases, which facilitates the manufacturing of the mask plate, and reduces the unfavorable effects on the manufacturing of the mask plate and the stretching of the mask plate, the unfavorable effects are caused by the difference of the densities of the sub-pixels and the difference of the opening ratios of the sub-pixels.

The color, the number, and the arrangement of the sub-pixels disposed in the first transitional display region 16 and the second transitional display region 18 can be set according to an actual situation, that is, according to the arrangement of the sub-pixels adjacent to the boundary between the first display region 12 and the second display region 14, so that the brightness can be changed smoothly from first display region 12 to the second display region 14. For example, in the embodiment shown in FIG. 5, the first transitional display region 16 includes one first sub-pixel 1*b*, one second sub-pixel 2*b*, and two third sub-pixels 3*b*, and the second transitional display region 18 includes four first sub-pixels 1*d*. The sub-pixels adjacent to the boundaries of the first display region 12, the first transitional display region 16, the second transitional display region 18, and the second display region 14 have a plurality of colors; the density of the sub-pixels, the opening ratio of the sub-pixels, and the brightness of the sub-pixels are changed smoothly, so that the visual difference caused by the difference of the brightness can be avoided, and the occurrence of dark spots or dark lines can be avoided, thereby improving the display performance. In some embodiments, any two closest sub-pixels of a same color arranged respectively in the second transitional display region 18 and the second display region 14 share one data line. In this way, the brightness can be changed smoothly or kept consistent from the second transitional display region 18 to the second display region 14, so that the visual difference caused by the difference of the brightness is further effectively reduced, and the occurrence of dark spots or dark lines between the first display region 12 and the second display region 14 is avoided.

The boundary between each two of the first transitional display region 16, the second transitional display region 18, and the second display region 14 can be a non-straight line, e.g., an arc-shaped line, a zigzag-shaped line, a square-wave-shaped line, an oblique line, etc., which is not limited herein. For example, in the embodiment shown in FIG. 5, the opening region of a sub-pixel arranged in the second transitional display region 18 is at least partially aligned with the opening region of an adjacent sub-pixel arranged in the second display region 14, thereby further reducing the difference of the brightness.

It should be understood that the term "boundary" used herein is not limited to as a visible actual line, but can be a virtual "boundary" formed by a plurality of sub-pixels located at the edges of the display regions.

It should also be understood that the shape of the sub-pixels in the embodiment of the present application is not limited herein. For example, the shape of the sub-pixels can be a rectangular shape as shown in the embodiments in FIG. 4 and FIG. 5, or can be a diamond shape or other polygon shapes.

In particular, in order to have a better display performance, the arrangement of the sub-pixels in the second transitional display region 18 needs to satisfy a certain condition, and the smooth change of the density of the sub-pixels, the opening ratio of the sub-pixels, and the brightness of the sub-pixels in a sequence of the first display region 12, the first transitional display region 16, the second transitional display region 18, and the second display region 14 can be achieved. Referring to FIG. 5, in some embodiments, a distance between two closest sub-pixels of a same color respectively arranged in the first display region 12 and the second transitional display region 18 is g, and the two closest sub-pixels of a same color are respectively adjacent to the sub-pixels of the first transitional display region 16; and in a row direction, a size of the opening region of the correspondingly sub-pixel disposed in the second transitional display region 18 is i, wherein z≤g≤(z+i). In other words, when the arrangement of the sub-pixels need to be designed, the arrangement of the sub-pixels of the second transitional display region 18 can be designed firstly, and then whether g satisfies z≤g≤(z+i) is determined. If yes, a sub-pixel 2b having a different color with the two closest sub-pixels can be disposed between the two closest sub-pixels 1a and 1d of a same color respectively disposed in the first display region 12 and the second transitional display region 18. In this way, the design requirements of the smooth change of the density of the sub-pixels, the opening ratio of the sub-pixels, and the brightness of the sub-pixels in sequence of the first display region 12, the first transitional display region 16, the second transitional display region 18, and the second display region 14 can be satisfied, and a better display performance can be achieved.

Optionally, at least one sub-pixel disposed in the second transitional display region 18 and some of the sub-pixels disposed in second display region 14 are arranged in the same column. In this way, a visual transitional display can be formed by the first transitional display region 16 and the second transitional display region 18 to compensate for the brightness difference caused by the difference of the arrangement of the sub-pixels adjacent to the irregular-shaped (e.g., an arc-shaped) contour line or the oblique contour line, so that the opening ratio can be changed smoothly in a sequence of the first display region 12, the first transitional display region 16, the second transitional display region 18, and the second display region 14, the uniformity of the brightness of the display panel 10 is improved, and the occurrence of dark spots and dark lines is reduced.

Optionally, in the row direction, the sizes of the opening region of the sub-pixels of a same color disposed in the second transitional display region 18 and the second display region 14 are equal, which facilitates the uniformity of the display, so that the display performance is further improved.

Based on the same concept, the present application further provides a display device, which includes the display panel 10 in the above-described embodiments.

Specifically, the display device can be applied to the field of mobile phone terminals, bionic electronic equipment, electronic skins, wearable devices, vehicle-mounted devices, Internet of Things (IoT) devices, artificial intelligence devices, etc. For example, the above-described display device can be a mobile phone, a tablet, a personal digital assistant (PDA), an iPod®, a smartwatch, etc.

What is claimed is:

1. A display panel, comprising:
a first display region;
a second display region, a density of sub-pixels of the first display region being greater than a density of sub-pixels of the second display region; and
a first transitional display region located between the first display region and the second display region; wherein
the sub-pixels of the first display region are arranged in a plurality of columns; each of the columns comprises a plurality of sub-pixels of different colors arranged alternatively; among the plurality of columns in the first display region, the sub-pixels of a same color disposed in two adjacent columns are arranged in a staggered manner;
the sub-pixels of the second display region are arranged in a plurality of columns; each of the columns comprises a plurality of sub-pixels of different colors arranged alternatively; among the plurality of columns in the second display region, the sub-pixels of a same color disposed in two adjacent columns are arranged in a staggered manner;
any two sub-pixels of a same color disposed in two adjacent columns respectively disposed in the first transitional display region and the first display region are arranged in a staggered manner, any two sub-pixels of a same color disposed in two adjacent columns respectively disposed in the first transitional display region and the second display region are arranged in a staggered manner;
an opening area of any one of the sub-pixels disposed in the first transitional display region is larger than an opening area of a sub-pixel disposed in the first display region and having a same color with the one of the sub-pixels disposed in the first transitional display region, and is smaller than an opening area of a sub-pixel disposed in the second display region and having a same color with the one of the sub-pixels disposed in the first transitional display region; and
an interval between any two closest sub-pixels of a same color arranged in two adjacent columns in the first display region is x; an interval between any two closest sub-pixels of a same color arranged in two adjacent columns respectively in the first transitional display region and the second display region is y; an interval between any two closest sub-pixels of a same color arranged in two adjacent columns in the second display region is z; wherein x≤y≤z.

2. The display panel according to claim 1, wherein two closest sub-pixels of a same color respectively disposed in the first transitional display region and the first display region share one data line.

3. The display panel according to claim 1, wherein the sub-pixels of a same color respectively disposed in some columns of the first display region and the first transitional display region are arranged in a same row.

4. The display panel according to claim 3, wherein in a column direction, a size of an opening region of a sub-pixel disposed in the first transitional display region is the same as a size of an opening region of a sub-pixel disposed in the first display region and having a same color with the sub-pixel disposed in the first transitional display region.

5. The display panel according to claim 3, wherein the sub-pixels of a same color disposed in the second display region are arranged in a plurality of rows.

6. The display panel according to claim 1, wherein a boundary between the first display region and the first transitional display region is a straight line or a non-straight line.

7. The display panel according to claim 6, wherein the boundary between the first display region and the first transitional display region is a non-straight line; and in a column direction, an opening region of one of the sub-pixels disposed in the first transitional display region is aligned with an opening region of one of the sub-pixels disposed in the first display region, the one of the sub-pixels disposed in the first display region is adjacent to the one of the sub-pixels disposed in the first transitional display region.

8. The display panel according to claim 6, wherein a distance between two sub-pixels of a same color respectively disposed in the first display region and the second display region is u, and the two sub-pixels of a same color are respectively adjacent to the sub-pixels of the first transitional display region; in a row direction, a size of an opening region of a corresponding sub-pixel disposed in the second display region and having a same color with the two sub-pixels of a same color is v; and wherein $z \leq u \leq (z+v)$.

9. The display panel according to claim 1, further comprising a second transitional display region contiguous to the first transitional display region and the second display region respectively; wherein:

the second transitional display region is located between the first transitional display region and the second display region;

any two sub-pixels of a same color disposed in two adjacent columns respectively disposed in the second transitional display region and the first transitional display region are arranged in a staggered manner; and any two sub-pixels of a same color disposed in two adjacent columns respectively disposed in the second transitional display region and the second display region are arranged in a staggered manner.

10. The display panel according to claim 9, wherein an opening area of any one of the sub-pixels disposed in the second transitional display region is larger than an opening area of a sub-pixel disposed in the first transitional display region and having a same color with the sub-pixels disposed in the second transitional display region, and is smaller than an opening area of a sub-pixel disposed in the second display region and having a same color with the sub-pixels disposed in the second transitional display region.

11. The display panel according to claim 9, wherein:

an interval between any two closest sub-pixels of a same color arranged in adjacent columns respectively in the first display region and the first transitional display region is w;

an interval between any two closest sub-pixels of a same color arranged in adjacent columns respectively in the second transitional display region and the second display region is e; and $x \leq w \leq e \leq z$.

12. The display panel according to claim 9, wherein a distance between two closest sub-pixels of a same color respectively disposed in the first display region and the second transitional display region is g, and the two closest sub-pixels of a same color are respectively adjacent to the sub-pixels of the first transitional display region; in a row direction, a size of an opening region of a corresponding sub-pixel disposed in the second transitional display region and having a same color with the two closest sub-pixels of a same color is i; and wherein $z \leq g \leq (z+i)$.

13. The display panel according to claim 9, wherein at least one sub-pixel disposed in the second transitional display region and at least one sub-pixel disposed in the second display region are arranged in a same column.

14. The display panel according to claim 9, wherein in a row direction, a size of an opening region of the sub-pixel disposed in the second transitional display region is the same as a size of an opening region of the sub-pixel disposed in the second display region and having a same color with the sub-pixel disposed in the second transitional display region.

15. The display panel according to claim 9, wherein any two closest sub-pixels of a same color respectively disposed in the second transitional display region and the second display region share one data line.

16. The display panel according to claim 1, wherein the interval between two closest sub-pixels of a same color arranged in two adjacent columns is a distance between two closest vertices of the two closest sub-pixels of a same color arranged in two adjacent columns.

17. A display device, comprising the display panel according to claim 1.

18. The display device according to claim 17, wherein the display panel is an organic light-emitting display panel.

19. The display device according to claim 17, further comprising at least one photosensitive component disposed on a rear side of the second display region, wherein external light enters the photosensitive component through the second display region.

* * * * *